United States Patent [19]

Yuyama et al.

[11] Patent Number: 5,053,707

[45] Date of Patent: Oct. 1, 1991

[54] APPARATUS FOR POSITIONING A PICK-UP COIL FOR DETECTING MAGNETIC FLUX QUANTUM TRAPPED IN A SUPERCONDUCTOR

[75] Inventors: Junpei Yuyama, Oribuhaitsu-Nakano 101, 2-14-51, Numame, Isehara-shi, Kanagawa-ken; Hirofumi Minami, Chigasaki; Humio Naruse, Okurayamahaimu 8-1001, 808-2, Mamedo-cho, Kohoku-ku, Yokohama-shi, Kanagawa-ken; Eiichi Goto, Fujisawa, all of Japan

[73] Assignees: Research Development Corporation of Japan; Junpei Yuyama; Humio Naruse, all of Tokyo, Japan

[21] Appl. No.: 494,987

[22] Filed: Mar. 16, 1990

[30] Foreign Application Priority Data

Mar. 17, 1989 [JP] Japan .................................. 1-65182

[51] Int. Cl.$^5$ .............................................. G01R 33/12
[52] U.S. Cl. ................................... 324/262; 324/248; 324/71.6; 505/843
[58] Field of Search ...................... 324/71.6, 248, 262, 324/239, 240, 235, 236, 228; 505/843, 726

[56] References Cited

U.S. PATENT DOCUMENTS

| | | | |
|---|---|---|---|
| 3,437,919 | 4/1969 | Dimeff | 324/248 |
| 3,445,761 | 5/1969 | Longhead | 324/257 |
| 3,646,813 | 3/1972 | Kuznietz et al. | 324/248 X |
| 3,696,290 | 10/1972 | Dreckmann et al. | 324/225 |
| 4,528,507 | 7/1985 | Domin et al. | 324/206 X |

OTHER PUBLICATIONS

Bosch, Physics Letters A, Jun. 29, 1987, vol. 122, No. 8, "Elementary Pinning Forces Measured Using Low Temperature Scanning Electron Microscopy".
IEEE Transactions on Magnetics, Lhota, "Observation of Vortex Structures in Josephson Junctions by Laser Scanning", May 1983, vol. MAG-19, No. 3, p. 1024.
IEEE Transactions on Magnetics, Hyun, "Elementary Pinning Force For An Isolated Vortex", Mar. 1987, vol. MAG-23, No. 2, p. 1176.
Superconductivity Electronics, Inc., Irie, "Flux Trapping In Electrodes of Josephson Tunnel Junctions", Feb. 2, 1989, pp. 98-101.
Physical Review Letters, Matsuda, "Magnetic Field of a Single Flux Quantum by Electron-Holographic Interferometry", May 22, 1989, vol. 62, No. 21, pp. 2519-2522.

Primary Examiner—Kenneth A. Wieder
Assistant Examiner—Warren S. Edmonds
Attorney, Agent, or Firm—Brumbaugh, Graves, Donohue & Raymond

[57] ABSTRACT

A head with a pick-up coil is attached to a supporter so that the head is freely movable along the direction perpendicular to the surface of a superconductor. Fluid spouted from the spout hole of the head maintains the height (gap space) of the head from the surface. The head is firmly fixed to the supporter in the direction along the surface. Since the relative position of the head in the direction along the surface of the superconductor is changable by drive means for moving the superconductor or the head, the distribution of the magnetic flux which is trapped in the superconductor is measured by scanning the surface of the superconductor with pick-up coil.

4 Claims, 7 Drawing Sheets

APPARATUS FOR POSITIONING A PICK-UP COIL FOR DETECTING MAGNETIC FLUX QUANTUM TRAPPED IN A SUPERCONDUCTOR

BACKGROUND OF THE INVENTION

This invention relates to apparatus for measuring the distribution of magnetic flux trapped in a superconducting magnetic shielding container which is required in such fields as Josephson computers and measurement of biomagnetics to attain high magnetic shielding, apparatus for detecting the distribution of magnetic flux trapped in a ground plane of Josephson circuits, and apparatus for detecting presence and the position of small magnetic flux, that is, magnetic flux quantum trapped in a superconductor.

A scanning electron microscope has been used to detect position of the magnetic flux quantum trapped within a Josephson junction. In this method, position of trapped magnetic flux is determined from the correlation between focus of the electron beam and variation of the maximum current value of the Josephson junction. However, this method is available only to the Josephson junctions, thus it is not applicable to a simple plate of superconductor and a ground plane or magnetic shield.

Another method for detecting the trapped magnetic flux has been developed. In this method, a superconductor to be detected is used as an electrode and a row of counter-electrodes is disposed on the electrode with an insulator between. The trapped magnetic flux is detected by sensing variation of the maximum current. However, it needs a specially prepared sample.

When the surface of the superconductor is scanned with a pick-up coil (by shifting the superconductor or the pick-up coil), the magnetic field component, perpendicular to the surface of the superconductor is detected, which detects only the trapped magnetic flux because the outer magnetic field is parallel to the surface of the superconductor due to the Meissner effect. In this case, the larger the distance between the pick-up coil and the surface, the more difficult the detection of the trapped magnetic flux. Therefore, it is preferable to keep the distance about $10 \sim 100$ μm. But, it is impossible to previously set this distance at the room temperature because of the non-uniform thermal contraction. If the distance between the surface of the superconductor and the pick-up coil is varied during the scanning of the pick-up coil, the intensity of the detected signals is also varied to cause noises. Thus, means for maintaining the distance is indispensable. In the case that a spacer is provided between the pick-up coil and the surface of the superconductor for maintaining the distance, the vibration due to the sliding will cause noises. Further rubbing by the spacer might damage the the surface of the superconductor. This damage which makes the inhomogeneity of the thickness will cause the magnetic flux to be trapped. Therefore, the spacer is not adequate for maintaining the distance.

A main object of this invention is to provide means for resolving the above problems.

SUMMARY OF THE INVENTION

According to this invention, apparatus for detecting the distribution of magnetic flux trapped in a superconductor is provided. The apparatus comprising:
a head with a spout hole for spouting a fluid,
a pick-up coil attached on said head,
supporting means for supporting said head so as to be freely movable along the direction perpendicular to the surface of the superconductor,
fluid supply means for supplying the fluid to the spout hole through controller means for controlling the pressure or the flow rate of the fluid,
cooling means for the fluid supplied to the said head,
drive means for shifting the relative position of said head to said superconductor along the parallel direction.

The head with the pick-up coil is attached to the supporter so that the head is freely movable along the direction perpendicular to the surface of the superconductor. Fluid spouted from the spout hole in the head maintains the height (gap space) between the head and the surface. The head is firmly fixed to the supporter in the direction along the surface. Since the relative position of the head in the direction along the surface of the superconductor is changable by drive means for shifting the superconductor or the head, the distribution of the magnetic flux is measured by scanning the surface of the superconductor with the pick-up coil.

The hydrodynamic mechanism will be explained with reference to FIG. 1.

When the fluid supplied to the head 1 passes through the spout hole 2 and rushes into a narrow gap (between the head 1 and the surface opposite thereto), the velocity $U_1$; of the fluid at the entrance can be calculated as follows by use of the equation for the adiabatic effusion.

$$U_1 = (RT_s/M)^{\frac{1}{2}} C_0 \{2\gamma/(\gamma-1)\}^{\frac{1}{2}} \{1-(P_1/P_s)^{1-1\gamma}\}^{\frac{1}{2}} \quad (1)$$

Where R is the gas constant, $T_s$ and $P_s$ are a temperature and a pressure of the supplied fluid, respectively, M is a molecular weight, $C_0$ is a flow rate constant, $\gamma$ is specific heat ratio, $P_1$ is a pressure just after it enters the gap. On the other hand, when the Bernoulli's theorem is applied to the fluid flowing through a narrow gap between the surface and the head, we can obtain the following equation.

$$\begin{aligned} P_1 &= P_a - (1/2)\rho \ U_1^2 \ [1 - (U_a/U_1)^2] \\ &= P_a - (1/2)\rho \ U_1^2 \ [1 - \{R_1/R_2 (1 - 2\delta/h)\}^2] \end{aligned} \quad (2)$$

Where $P_a$ is an environment pressure, $\rho$ is a density of the fluid, $U_a$ is a velocity of the fluid flowing at the outer edge of the head 1, $R_1$ is a diameter of the spout hole, $R_2$ is an outside diameter, h is a lifted height (gap space), and $\delta$ is a displacement thickness. This displacement thickness relates to a thickness of a boundary layer developing a wall due to the viscosity of the fluid. $P_1$ and $U_1$ which are unknown can be obtained by solving equations (1) and (2). Further, pressure of each position is obtained by a similar equation as (2). The outer portion has a longer circumference and the fluid path thereat has a larger cross section. Therefore, a pressure distribution can be obtained as shown in FIG. 2. As can be seen from the equation (2), this pressure distribution depends on h through the ratio of the displacement thickness $\delta$ and the height h of the gap. Forces acting on the head can be calculated as in FIG. 3 from the pressure distribution. The force becomes repulsive when the gap between the head and the surface is small and attractive when the gap is large. At a certain height, the force becomes zero. If forces due to other than the fluid mechanism, e.g. rigidity of the fluid supply pipe, are negligible, the head floats stably at the certain height where the lifting force is zero. FIG. 3 shows the relation between the lifting force and the height of the gap when the supply gas pressure is 820 Torr. When the compressibility of the fluid is taken into account in the equation (2), the results quantitatively changes, but not substantially.

PREFERRED EMBODIMENT OF THE INVENTION

Figure 1:
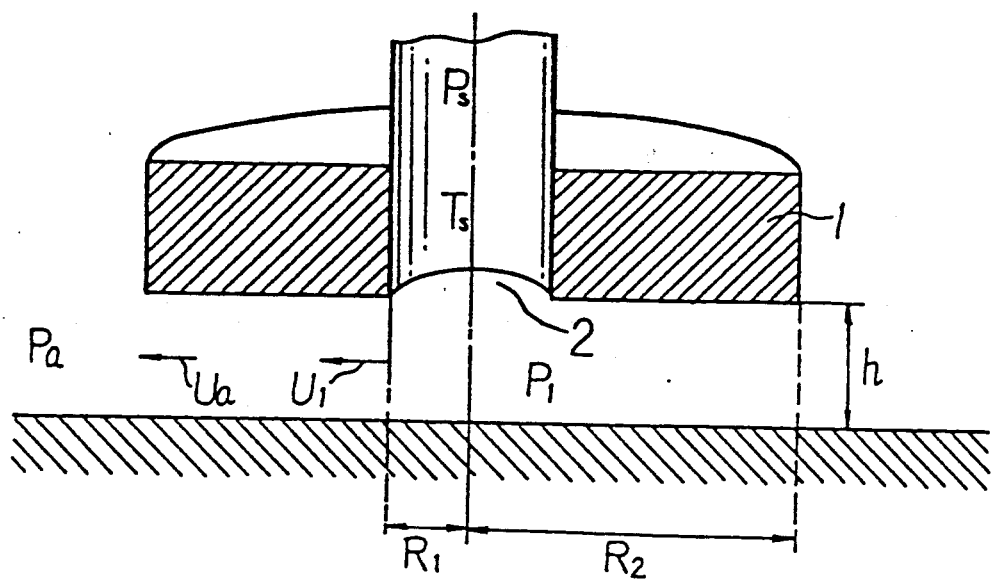
FIG. 1 illustrates the principle of the floating head according to this invention.
Figure 2:
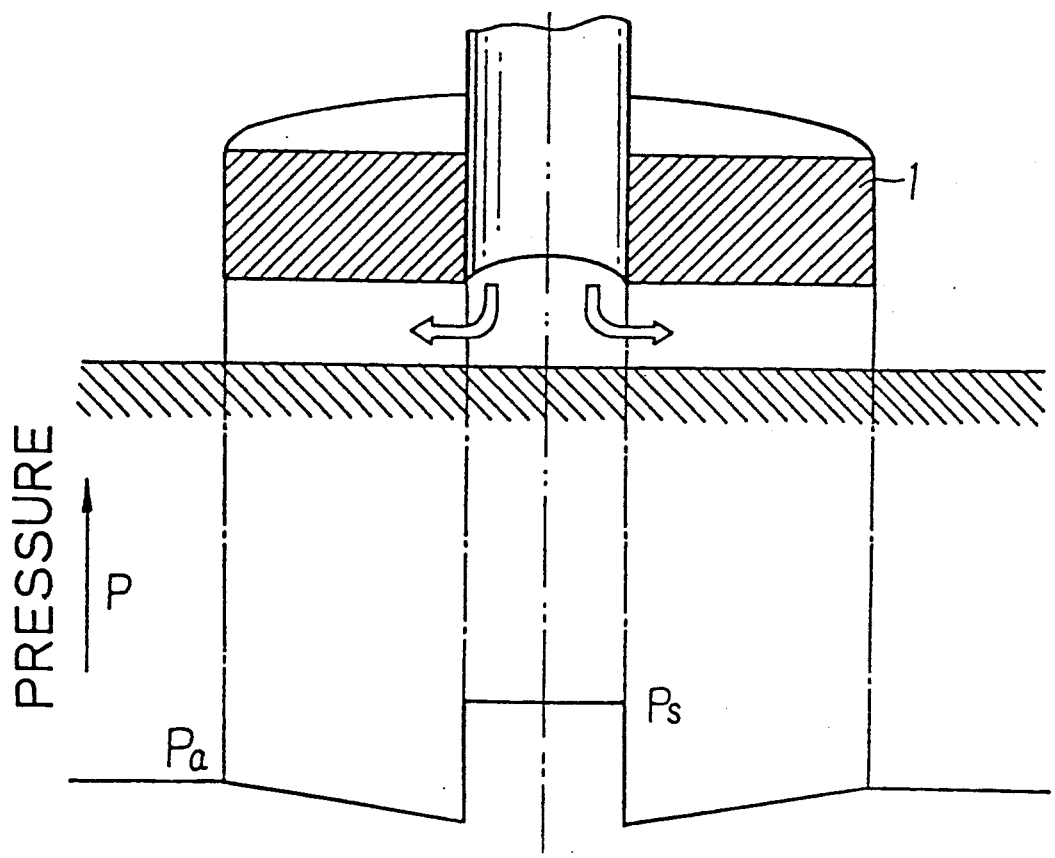
FIG. 2 shows the distribution of pressures in the gap of FIG. 1.
Figure 3:
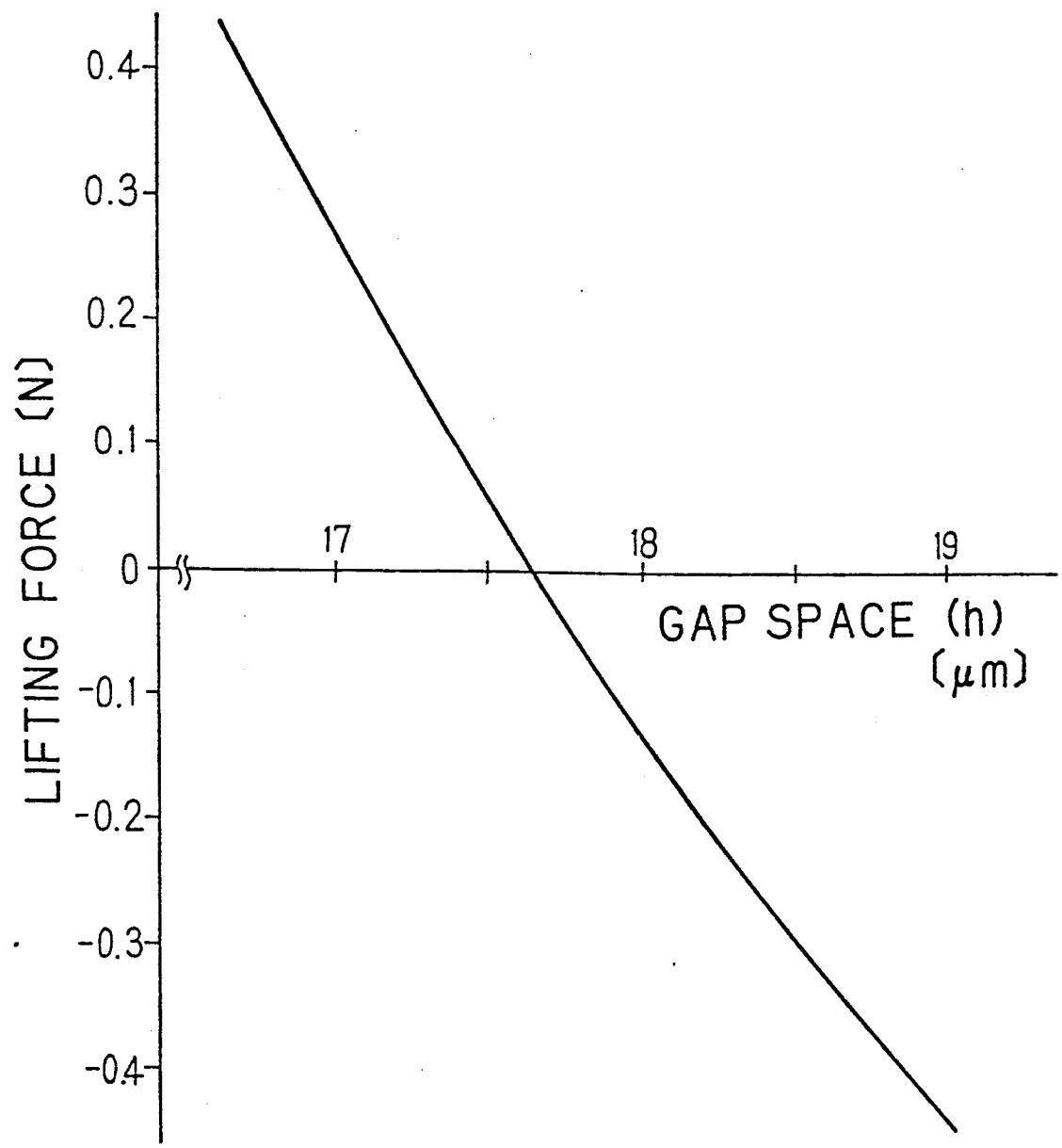
FIG. 3 shows a relation between the force to the head and the gap space.
Figure 4:
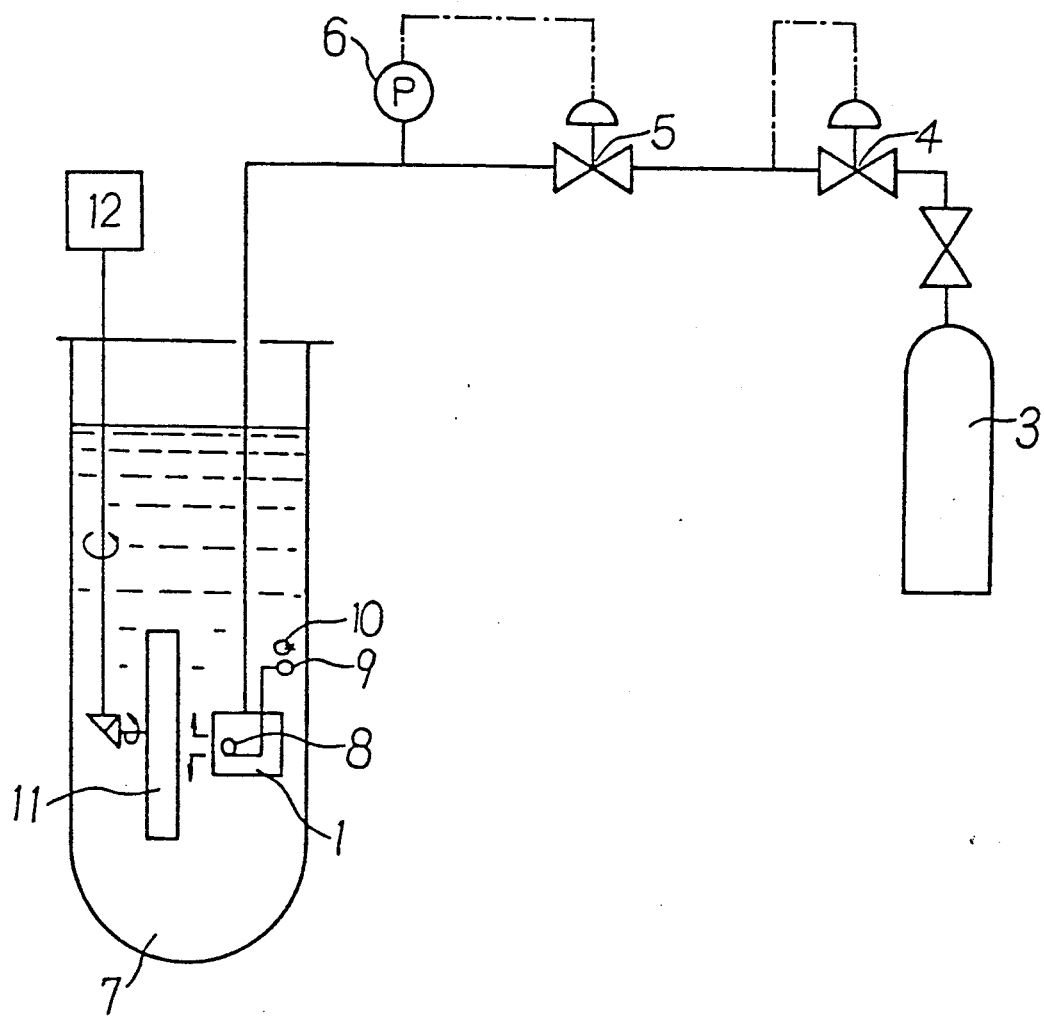
FIG. 4 shows apparatus for measuring the distribution of the magnetic flux according to this invention.
Figure 6:
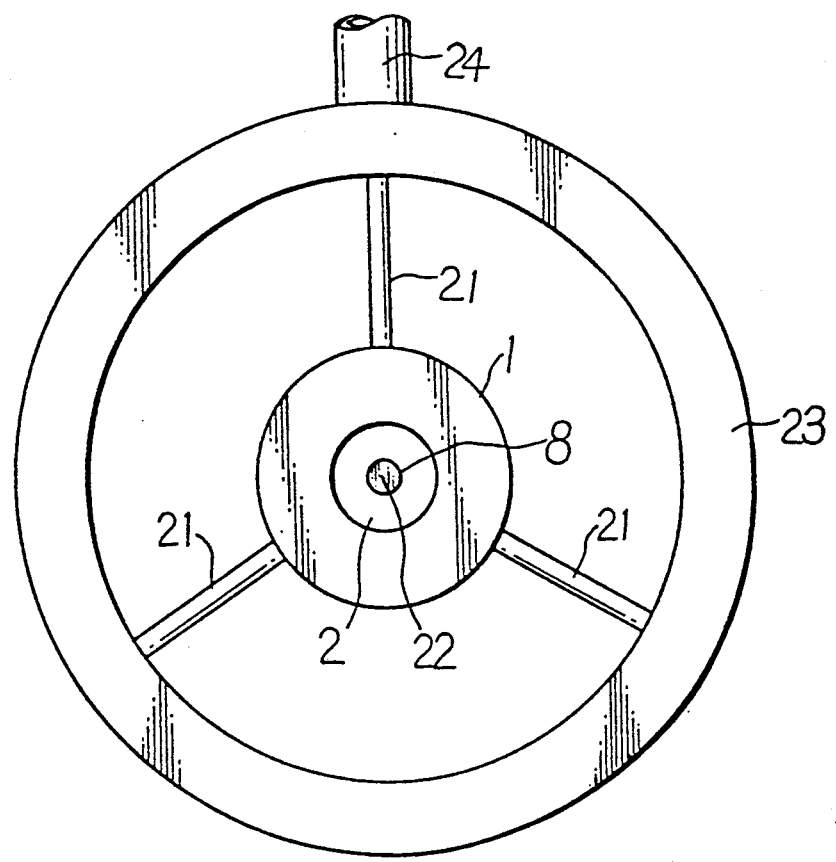
FIG. 6 shows a plane view of a head according to this invention, taken from the superconductor side.

FIGS. 4 and 6 show an example of this invention. FIG. 4 shows a system for detecting magnetic flux trapped in a superconductor according to this invention. The head 1 is supplied with Helium gas which flows from a high pressure bomb 3 through a pressure reducing valve 4. The pressure of the gas is maintained at a pressure by means of a gauge 6 and a flow control valve 5. The supplied Helium, spouts out from a spout hole. Magnetic flux trapped in a superconductor 11 is sensed by a pick-up coil 8 and detected by SQUID 10 through an input coil 9. The superconductor 11 is vertically movable and rotatable by means of a drive mechanism 12 and the pick-up coil 8 can shift to an arbitrary position on the superconductor 11.

Figure 5:
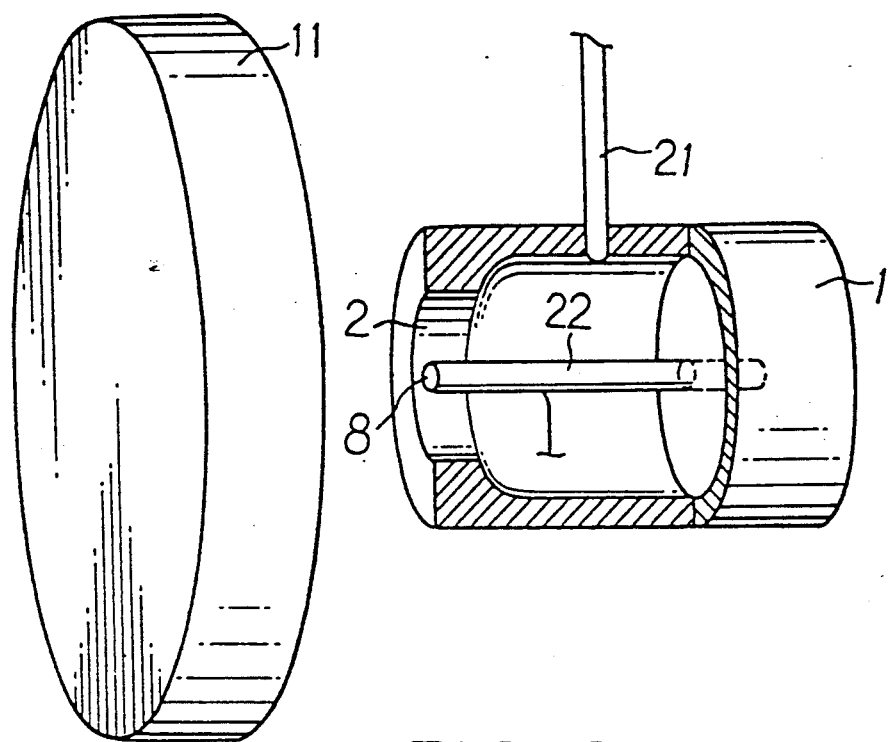
FIG. 5 shows a cross section of a head of an embodiment of this invention, taken on the plane including the central axis thereof.
Figure 7:
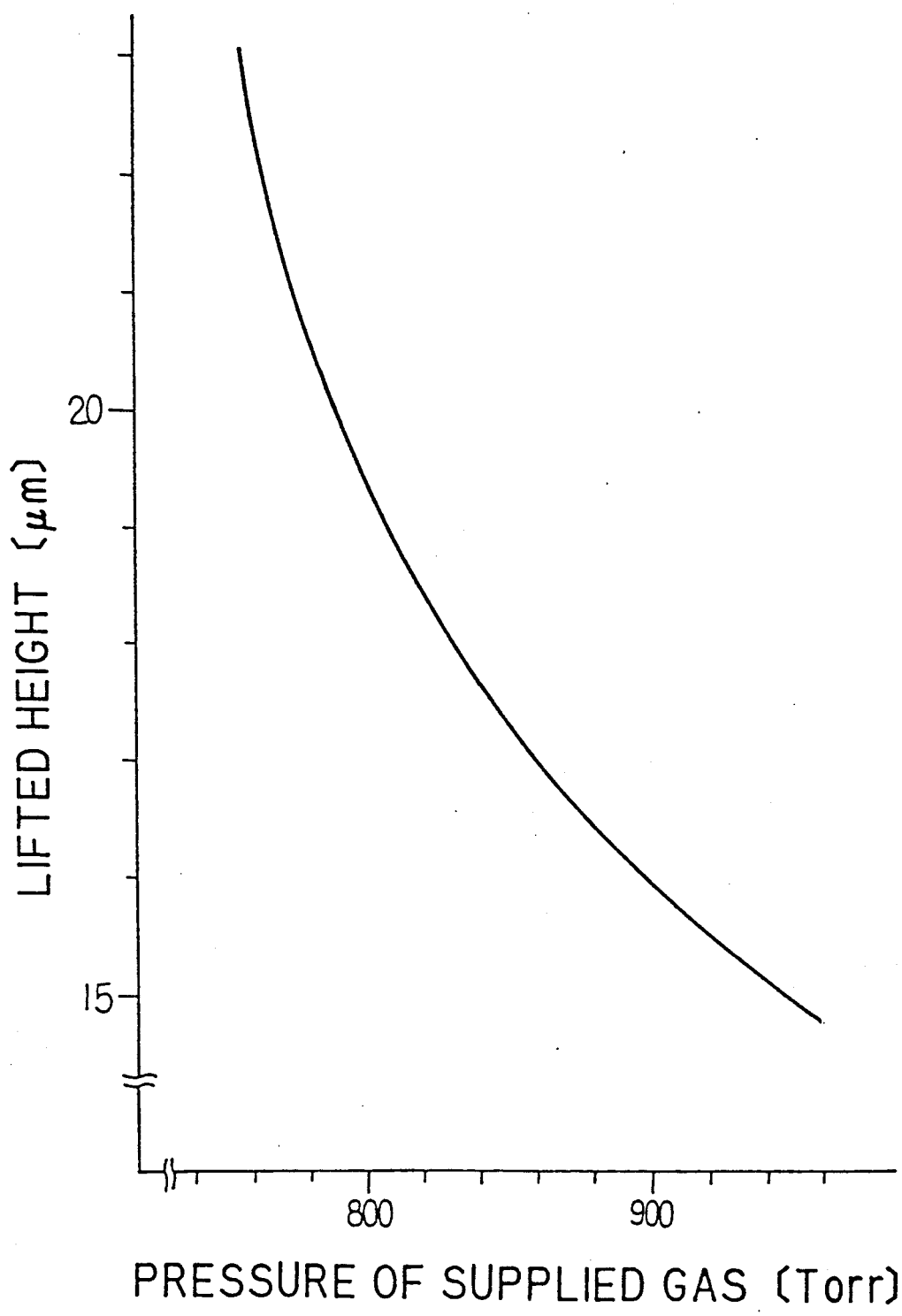
FIG. 7 shows a relation between pressures of supplied gas and the lifted height.
Figure 8:
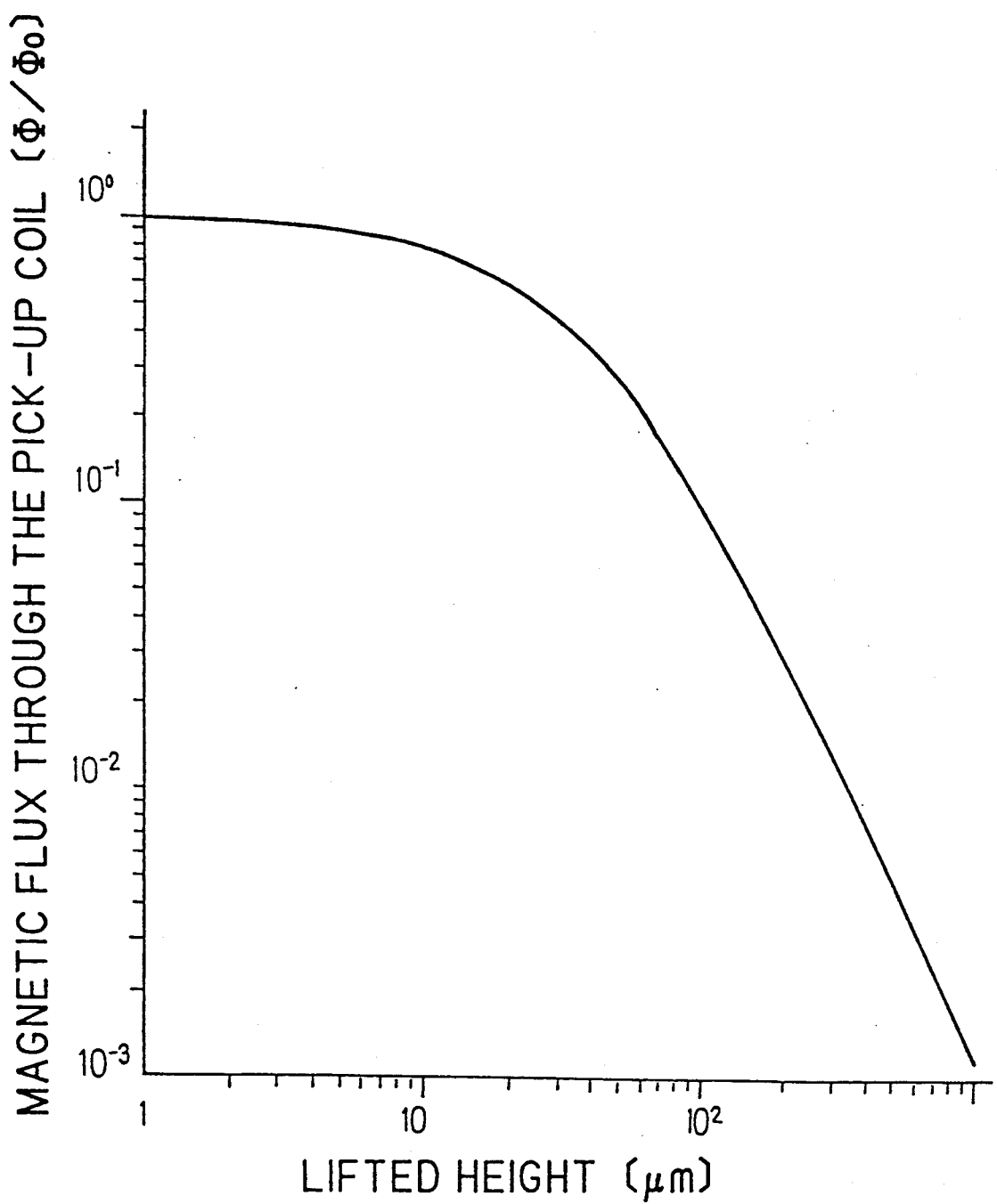
FIG. 8 shows a relation between the amount of the magnetic flux going through the pick-up coil and the lifted height.

FIG. 5 is a partial cross section of the head 1. Helium gas is cooled down to near the liquid helium temperature, supplied to the head 1 through supply pipes 21 and spouts from the spout hole 2. The coil 8 is wound around the core 22 of a non-magnetic material. FIG. 6 shows a plane view of the head 1 from the superconductor 11 side. Helium gas is supplied through a large supply pipe 24 from a room temperature portion. The gas is then divided into three parts in a hollow ring frame 23 and fed to the head 1 through thin supply pipes 21. Although the head 1 is firmly fixed in the direction along the surface of the superconductor 11 by elastic resistance along the axial direction of the supply pipes 21, the head is easily movable due to bend in the supply pipes 21. FIG. 7 shows a relation between pressures of the supplied gas and the lifted height (gap space) where the lifting force becomes zero. From this figure, it can be found that a lifted height of 15~25 μm is possible. FIG. 8 shows a relation of the amount of the magnetic flux sensed by the pick-up coil 8 to the lifted height (gap space) between the coil and the surface of the superconductor wherein the magnetic flux source is assumed as a single magnetic flux quantum trapped in the superconductor 11. The smaller the lifted height, the larger the amount of the magnetic flux and the easier the measurement is. Thus, the ratio of signal to noises is improved.

Figure 9:
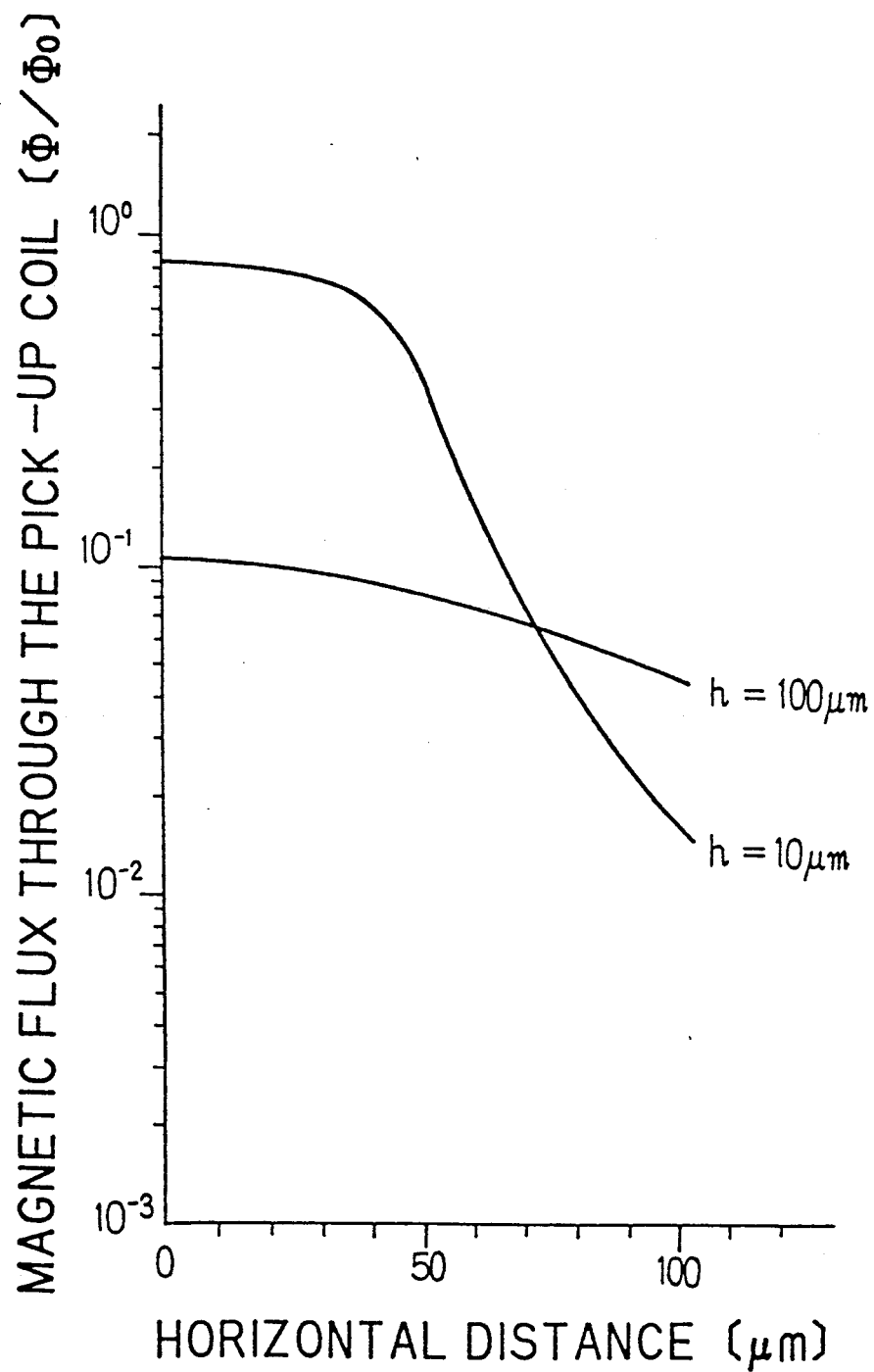
FIG. 9 shows a relation of the distance between a magnetic flux source and the center axis of the pick-up coil to the amount of the magnetic flux detected by the pick-up coil.

FIG. 9 shows a relation of the horizontal distance between the center axis of the pick-up coil 8 and the magnetic flux source to the amount of magnetic flux sensed by the pick-up coil 8. The smaller the lifted height h, the steeper the variation of the detected magnetic flux and the higher the spatial resolution.

Though the magnetic flux transformer in FIG. 4 comprises the pick-up coil 8 and the input coil 9, it is possible to directly sense the magnetic flux by means of a SQUID ring 10 without the pick-up coil 8.

Although Helium is supplied from the high pressure gas bomb 3, it is possible to recover Helium gas spouted from the spout hole 2 and condense the vaporized gas for resupply.

In the example of FIG. 4, the helium gas spouts into the liquid helium 7. But, a chamber filled with helium gas can be provided in the liquid helium so that the head 1 and the superconductor 11 is enclosed in the chamber.

Though cooling means for helium gas is not clearly shown in FIG. 4, a method for directly causing heat exchange with liquid helium can be used and also a heat exchanger can be used to cause heat exchange with veporized vaporized gas.

As a pick-up coil 8 shown in FIG. 5, a first derivative gradiometer can be used to further reduce the effect of the outer magnetic field.

In FIG. 6, the head 1 is supported by the three thin pipes. However, only one or two thin pipes and other thin wires can be used. The gas supply can be carried out by use of another bellows with three wires for supporting the head.

According to this invention, it is easy to detect presence and the position of the magnetic flux trapped in the wall of the superconductor shielding container, the ground plane for the Josephson devices and so on. When the detected magnetic flux is excluded, extremely weak magnetic field is realized and the errors due to the flux trapped on the Josephson device is prevented.

What is claimed is:

1. An apparatus for positioning a pick-up coil for detecting magnetic flux quantum trapped in a superconductor comprising:

a head member having a planar surface with a bore through said planar surface in which a spout means for spouting a fluid is passed therethrough with said pick-up coil mounted on said spout means and magnetically connected to a SQUID magnetometer;

supporting means for supporting said head member so as to be freely movable along a direction perpendicular to a surface of said superconductor;

fluid supply means for supplying the fluid to the spout means through controller means for controlling the pressure of the flow rate of the fluid along the surface of the superconductor to keep constant a gap between said pick-up coil and the superconductor surface with the gap being small compared to the diameter of the pick-up coil;

cooling means for cooling the fluid supplied to said head; and drive means for shifting the relative position of said head to said superconductor along a direction parallel to the surface of the superconductor.

2. An apparatus as set forth in claim 1, wherein said fluid is helium gas.

3. An apparatus as set forth in claim 1, wherein the gas flows through the planar surface of the head member which faces the surface of the superconductor and the surface of the superconductor.

4. An apparatus as set forth in claim 3, wherein said planar surface of the head member is circular and the bore is provided at the center of the circular surface of the head member.

* * * * *